United States Patent
de Ridder et al.

(10) Patent No.: US 11,121,014 B2
(45) Date of Patent: Sep. 14, 2021

(54) DUMMY WAFER STORAGE CASSETTE

(71) Applicant: ASM International N.V., Almere (NL)

(72) Inventors: Chris G. M. de Ridder, Almere (NL); Theodorus G. M. Oosterlaken, Almere (NL); Adriaan Garssen, Almere (NL)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 16/000,353

(22) Filed: Jun. 5, 2018

(65) Prior Publication Data
US 2019/0371639 A1 Dec. 5, 2019

(51) Int. Cl.
H01L 21/673 (2006.01)
H01L 21/677 (2006.01)

(52) U.S. Cl.
CPC .. *H01L 21/67373* (2013.01); *H01L 21/67386* (2013.01); *H01L 21/67772* (2013.01)

(58) Field of Classification Search
CPC ......... H01L 21/67017; H01L 21/67386; H01L 21/67373; H01L 21/67772
See application file for complete search history.

(56) References Cited

U.S. PATENT DOCUMENTS

| 5,349,762 | A | 9/1994 | Kato et al. |
| 5,457,896 | A | 10/1995 | Kato et al. |
| 6,540,467 | B1* | 4/2003 | Zohni ................. H01L 21/6732 206/710 |
| 8,463,415 | B2 | 6/2013 | Mochizuki |
| 2003/0010672 | A1* | 1/2003 | Simpson ........... H01L 21/67326 206/711 |
| 2009/0003977 | A1* | 1/2009 | Aburatani ......... H01L 21/67109 414/217 |
| 2016/0025893 | A1* | 1/2016 | Bandy ..................... G01V 8/12 356/620 |

* cited by examiner

*Primary Examiner* — Saul Rodriguez
*Assistant Examiner* — Willie Berry, Jr.
(74) *Attorney, Agent, or Firm* — Preti Flaherty Beliveau & Pachios LLP

(57) ABSTRACT

A dummy wafer storage cassette for storing dummy wafers. The dummy wafer storage cassette may have more than 30 wafer slots for accommodating dummy wafers. The dummy wafer cassette may have substantially the same outer dimensions as a standardized wafer cassette with 25 wafer slots and a pitch of the wafer slots of the dummy wafer storage cassette may be smaller than a pitch between the wafer slots in the standardized wafer cassette.

10 Claims, 2 Drawing Sheets

DUMMY WAFER STORAGE CASSETTE

FIELD

The invention relates to a dummy wafer storage cassette for storing dummy wafers, as well as a batch wafer processing apparatus comprising at least one dummy wafer storage cassette.

The invention also relates to a method for treating wafers in a processing chamber of a batch wafer processing apparatus with the aid of a dummy wafer storage cassette.

BACKGROUND

EP 1 341 213 describes an apparatus for treating wafers which, among others, comprises a cassette storage carousel. The carousel can accommodate cassettes for the storing of wafers. Said used cassettes may be the highly standardized FOUP (Front Opening Unified Pod) wafer storage cassettes for wafers with a diameter of 300 mm or other type of standardized cassettes for wafers with a diameter of 200 , which may have 25 slots for accommodating 25 wafers.

The apparatus may have a wafer storage box handling apparatus which may take a cassette from an input/output station and place it in the cassette storage carousel. The cassettes may also be placed manually in the cassette storage carousel. The apparatus may also comprise a wafer handler, by means of which wafers can be taken out of the cassette and placed in a boat for the treatment within the processing chamber of the apparatus.

During treatment of wafers within a processing chamber of a batch furnace, it may be beneficial for the process to have all spaces in the wafer boat filled. Dummy wafers, also called fillers, may be used to fill the empty spaces between the production wafers. Dummy wafers may also be placed on top and/or bottom of the wafer stack in the wafer boat to improve the reaction properties for the production wafers placed in between these dummy wafers. In general dummy wafers can be reused and may stay in the apparatus until they need to be cleaned. When using dummy wafers in the apparatus, storing the dummy wafers in the storage device reduces the storing capacity for production wafers. For configurations where a high number of dummy wafers is required this may lead to a storage problem. The obvious solution for this problem is to increase the number of cassette receiving sites in the storage device. However, such a solution requires extra space in the apparatus which may be not available and/or may be costly.

SUMMARY

Accordingly there may be a need to provide an improved storage solution for dummy wafers.

According to an embodiment a dummy wafer storage cassette according to claim 1 may be provided. The wafer storage cassette may be a dummy wafer storage cassette for storing dummy wafers and may have more than 30 wafer slots for accommodating the dummy wafers.

Because more dummy wafers can be stored in the dummy wafer storage cassette than in the standardized wafer cassette, less of said dummy wafer storage cassettes are needed to store a same amount of dummy wafers than would be needed when using standardized wafer cassettes having 25 slots. Thus, more space in the storage device may be available for storing standardized wafer cassettes which accommodate production wafers.

According to a further embodiment a batch wafer processing apparatus according to claim 8 is provided. More particularly, the invention provides a batch wafer processing apparatus for batch treatment of a batch of wafers which are supported in a wafer boat. The batch wafer processing apparatus may be provided with a storing device comprising a number of cassette receiving sites and at least one dummy wafer storage cassette. Each cassette receiving site of the number of cassette receiving sites is configured for storing a standardized wafer cassette with 25 wafer slots.

Because the storing device of the batch wafer processing apparatus uses the dummy wafer storage cassette less of said dummy wafer storage cassettes are needed to store a same amount of dummy wafers than would be needed when using standardized wafer cassettes. This means that more standardized wafer cassettes with production wafers can be stored, without the need to change the design of the storing device. The invention therefore provides a solution to the storage problem.

According to yet a further embodiment there is provided a method according to claim 13. More particularly, the invention provides a method for treating wafers in a processing chamber of a batch wafer processing apparatus for batch treatment of a batch of wafers which are supported in a wafer boat. The method comprises providing a standardized wafer cassette with, for example, 25 slots and accommodating a plurality of production wafers, placing at least one of the plurality of production wafers and at least one dummy wafer from a dedicated dummy wafer storage cassette having more than 30 wafer slots for accommodating dummy wafer in the wafer boat of the batch wafer processing apparatus, treating the wafers in the wafer boat within the processing chamber, and placing the at least one dummy wafer back in the dummy wafer storage cassette.

Since dummy wafers can be used multiple times, the dummy wafer storage cassette can be kept inside the batch wafer processing apparatus. Only when a dummy wafer is needed the dummy wafer can be taken out of the dummy wafer storage cassette and placed in the wafer boat. After treatment the dummy wafer may be placed back in the dummy wafer storage cassette for storing until it is needed again. By using a dummy wafer storage cassette having more than 30 wafer slots, a higher amount of dummy wafers can be stored, than would be possible by using a standardized wafer cassette for storing dummy wafers. This method therefore alleviates the above mentioned storage problem.

Various embodiments are claimed in the dependent claims, which will be further elucidated with reference to an example shown in the figure. The embodiments may be combined or may be applied separate from each other.

DETAILED DESCRIPTION OF THE FIGURES

Figure 1:
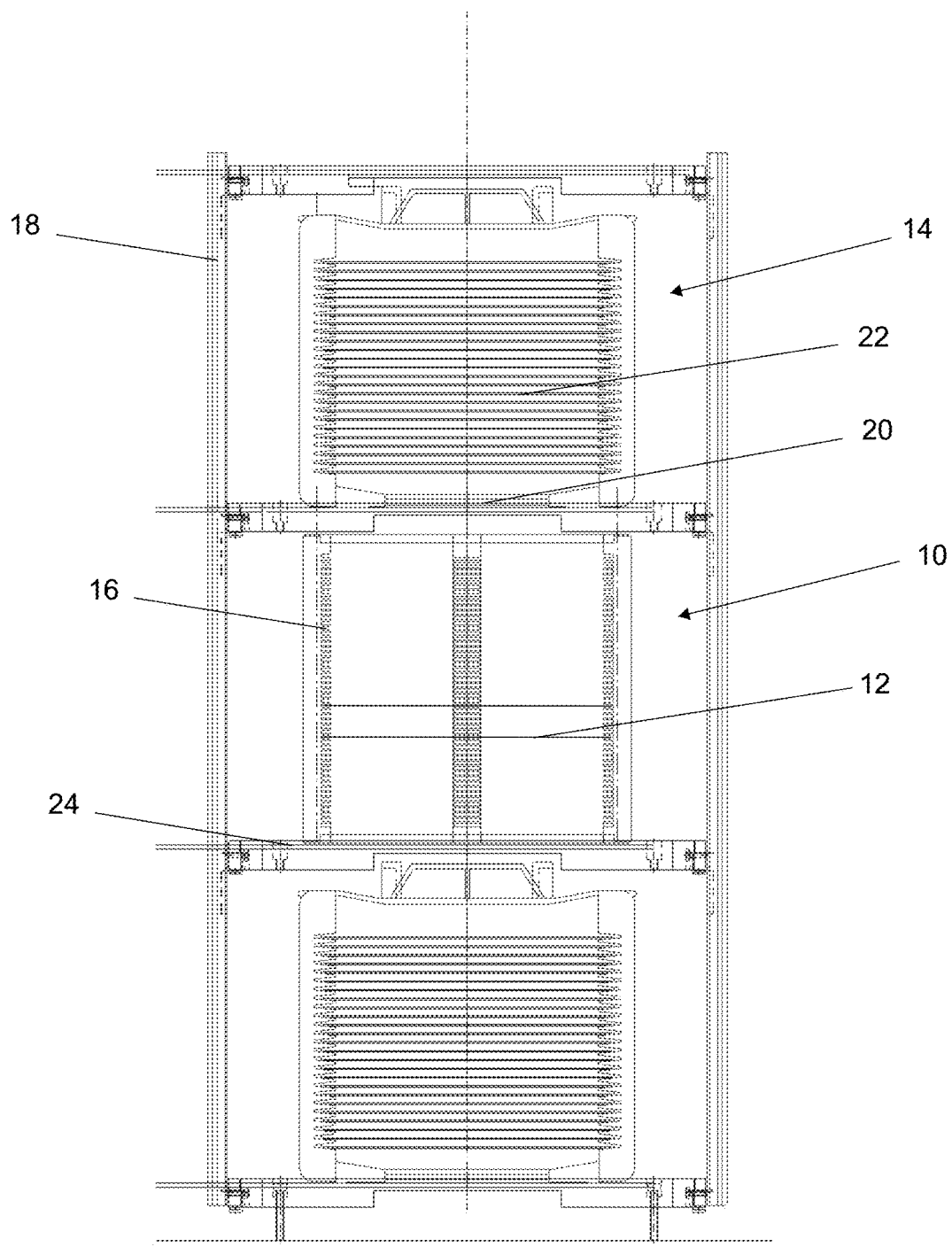
FIG. 1 shows a cross-sectional side view of an example of a storing device according to the present invention, with therein an example of a dummy wafer storage cassette according to the present invention.
Figure 2:
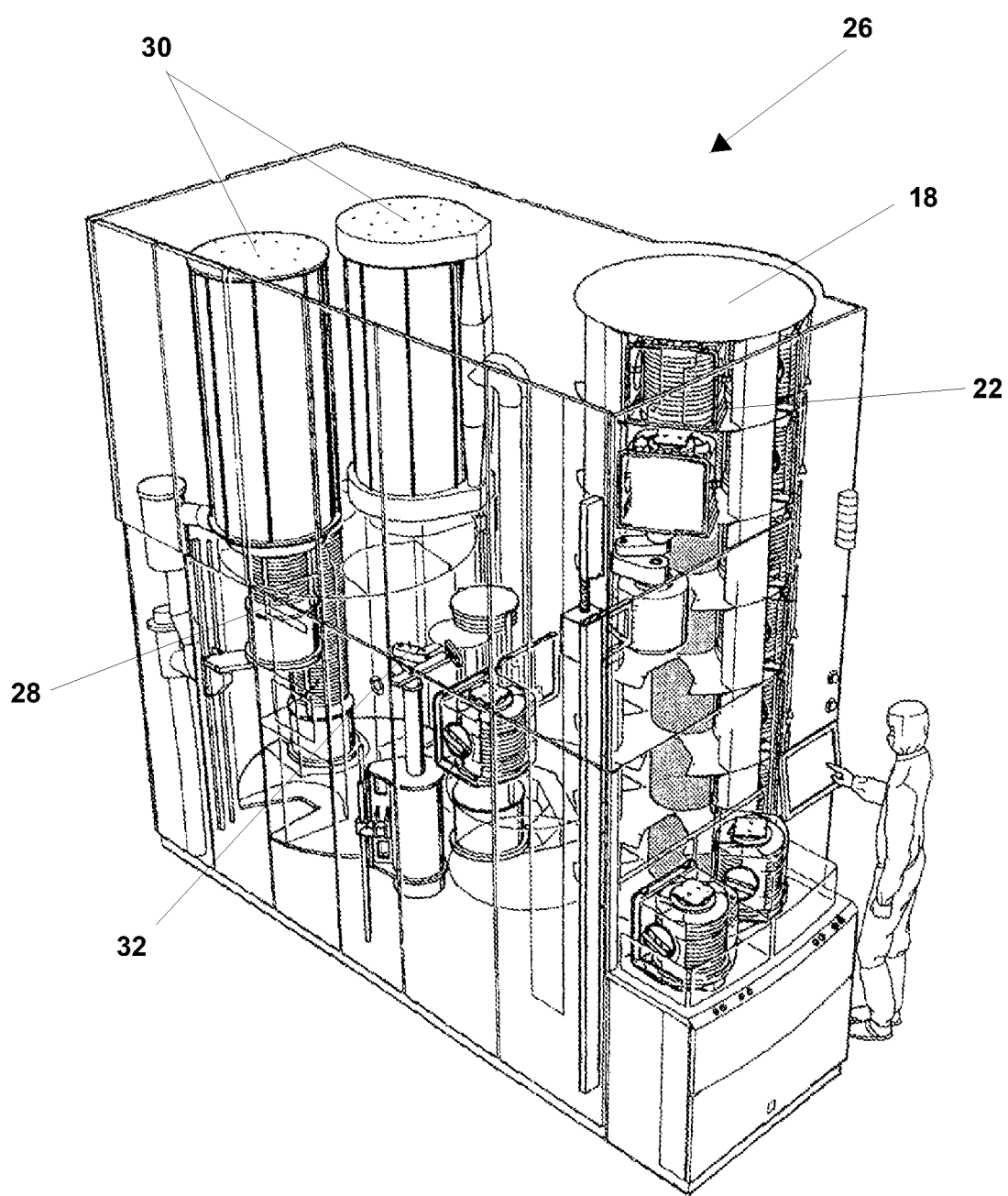
FIG. 2 shows a perspective side/top view of an example of a wafer processing apparatus according to the present invention.

In this application similar or corresponding features are denoted by similar or corresponding reference signs. The description of the various embodiments is not limited to the example shown in the figures and the reference numbers used in the detailed description and the claims are not intended to limit the description of the embodiments, but are included to elucidate the embodiments by referring to the example shown in the figure.

The disclosure relates to a wafer storage cassette 10 for storing wafers 12, 22 having a diameter of 150, 200, or 300 mm. The wafer storage cassette 10 according to the present disclosure may be a dedicated dummy wafer storage cassette 10 for storing dummy wafers 12 and may have more than 30 wafer slots 16 for accommodating the dummy wafers 12.

The effects and advantages of the wafer storage cassette 10 have been described in the summary section and these effects and advantages are inserted herein by reference.

In an embodiment, the wafer storage cassette 10 may have substantially the same outer dimensions as a prior art standardized wafer cassette 14 with 25 wafer slots. A pitch of the wafer slots 16 of the dummy wafer storage cassette 10 may be smaller than a pitch between the wafer slots in the prior art standardized wafer cassette 14 which may be 10 mm for a storage cassette for storing wafers with a 300 mm diameter. The pitch of the wafer slots 16 of the dummy wafer storage cassette 10 for storing wafers with a 300 mm diameter may be between 3 to 9, preferably 4 to 8, most preferably 5 to 7 mm.

The pitch of 10 for the wafer slots in the standardized wafer cassette 14 is dimensioned such as to ensure that wafers 22 within the standardized wafer cassette 14, which wafers 22 are used for production, can be handled by any wafer handling tool in a semiconductor factory. For dummy wafers, this requirement may not be as strict because they may only be handled in one tool by one wafer handler for the majority of time. The smaller pitch of the wafer slots 16 of the dummy wafer storage cassette 10 may make it possible to have more wafer slots 16 within the dummy wafer storage cassette 10, as opposed to the standardized wafer cassette 14.

In an embodiment the wafer storage cassette may be a FOUP wafer cassette being box shaped with an open front and a door to close the open front of the box and defining an interior. The box may have a top wall, a pair of sidewalls, a back wall and a bottom. The side walls may be provided with two sets of opposing extensions at each side of the interior defining a plurality of slots for receiving 300 mm diameter wafers through the open front.

In an embodiment, the dummy wafer storage cassette 10 for storing 300 mm diameter wafers may have a height of 290-320 mm. This is the same height as the standardized FOUP wafer cassette for storing 300 mm diameter wafers.

In an embodiment, the dummy wafer storage cassette 10 for storing wafers with a diameter of 150 or 200 mm may have a pitch which may be smaller than a pitch between the wafer slots in the prior art standardized wafer cassette 14 for wafer with a 200 mm diameter which may be around 6 mm. For example, the pitch in the dummy wafer cassette may be between 2 to 6 mm, preferably 3 to 4 mm, for 200 mm diameter wafers. The dummy wafer cassette may have a height of between 150-300 mm.

In an embodiment, the dummy wafer storage cassette 10 may have 50 wafer slots 16. In this way the dummy wafer storage cassette 10 has a double capacity compared to the standardized wafer cassette 14.

The present disclosure also provides a batch wafer processing apparatus for batch treatment of a batch of wafers 12, 22 which are supported in a wafer boat 28. The batch wafer processing apparatus may be provided with a storing device 18 comprising a number of cassette receiving sites 20 and at least one dummy wafer storage cassette 10. Each cassette receiving site 20 of the number of cassette receiving sites 20 may be configured for storing a standardized wafer cassette 14 with 25 wafer slots. The at least one dummy wafer storage cassette 10 may accommodate a plurality of dummy wafers 12 and may be mounted in one of the number of cassette receiving sites 20.

The effects and advantages of the batch wafer processing apparatus 26 have been described in the summary section and these effects and advantages are inserted here by reference.

In an embodiment, the storing device 18 may be a cassette storage carousel. The cassette storage carousel may comprise at least one platform stage 24. The cassette receiving sites 20 may be provided on the at least one platform stage 24. Each platform stage 24 may be connected to a central support which is mounted rotably around a vertical axis through the central support.

A carousel is a compact manner to store cassettes 10, 14. A cassette 10, 14, for example the standardized wafer cassette 14, can be placed in the carousel on one side, whilst the rotation of the carousel provides access to multiple cassette receiving sites 20. When the carousel comprises at least one platform stage 24, the cassette can be placed upon said platform stage 24.

In an embodiment the at least one dummy wafer storage cassette 10 may be rigidly mounted in the storing device 18. In another embodiment the at least one dummy wafer storage cassette 10 may be removably supported in the storing device 18.

Since dummy wafers 12 can be used multiple times, these dummy wafers 12 need not be transferred outside the batch wafer processing apparatus 26 after a batch treatment. The dummy wafer storage cassette 10 can therefor be kept inside the wafer processing apparatus 26 also.

In an embodiment the batch wafer processing apparatus 26 may comprise a processing chamber 30 for processing the boat 28 of wafers 12, 22, and a wafer handler 32 for handling dummy wafers 12 between wafer slots 16 in the at least one dummy wafer storage cassette 10 and the boat 28. The wafer handler 32 may be constructed and arranged for handling dummy wafers 12 with a diameter of 300 mm and positioned at a pitch between 3 to 9, preferably 4 to 8, most preferably 5 to 7 mm in the wafer slots 16 of the at least one dummy wafer storage cassette 10. Alternatively, the wafer handler 32 may be constructed and arranged for handling dummy wafers 12 with a diameter of 150 or 200 mm and positioned at a pitch between 2 to 9, preferably 3 to 4 mm in the wafer slots 16 of the at least one dummy wafer storage cassette 10.

The present disclosure further provides a method for treating wafers 12, 22 in a processing chamber 30 of a batch wafer processing apparatus 26 for batch treatment of a batch of wafers 12, 22 which are supported in a wafer boat 28. The method comprises providing a standardized wafer cassette 14 with 25 slots and accommodating a plurality of production wafers 22, placing at least one of the plurality of production wafers 22 and at least one dummy wafer 12 from a dedicated dummy wafer storage cassette 10 having more than 30 wafer slots for accommodating dummy wafer 12 in the wafer boat of the batch wafer processing apparatus 26, treating the wafers 12, 22 in the wafer boat within the processing chamber 30, and placing the at least one dummy wafer 12 back in the dummy wafer storage cassette 10. The placing of the at least one of the plurality of production wafers 22 and/or the at least one dummy wafer 12 may be done with a wafer handler 32. The wafer handler 32 may be constructed and arranged for handling dummy wafers 12 positioned at a pitch between 3 and 9, preferably 4 and 8, most preferably 5 to 7 mm in the wafer slots 16 of the at least one dummy wafer storage cassette 10.

The effects and advantages of the method have been described in the summary section and these effects and advantages are inserted here by reference. The dedicated dummy wafer storage cassette may be the above described dummy wafer storage cassette 10 according to the invention.

Dummy wafers 12 may be transported in and out the batch wafer processing apparatus 26 with the standard wafer cassettes 14. It is however advantageously to transfer them to the dedicated dummy wafer storage cassette 10 within the apparatus 26 because these dedicated dummy wafer storage cassettes 10 have more storage space. A wafer handler in the tool may be able to handle wafers 12, 22 positioned at different pitches in the cassettes 10, 14. It is also possible to transport the dummy wafers 12 with the dedicated dummy wafer storage cassette 10 in and out of the batch wafer processing apparatus 26. The latter may only be possible if other tools in a semiconductor manufacturing fab may be able to handle the pitch of the wafers in the dummy wafer storage cassette 10.

The various embodiments which are described above may be used implemented independently from one another and may be combined with one another in various ways. The reference numbers used in the detailed description and the claims do not limit the description of the embodiments nor do they limit the claims. The reference numbers are solely used to clarify.

LEGEND

10—dummy wafer storage cassette
12—dummy wafer
14—standardized wafer cassette
16—wafer slot
18—storing device
20—cassette receiving site
22—production wafer
24—platform stage
26—batch wafer processing apparatus
28—wafer boat
30—processing chamber
32—wafer handler

The invention claimed is:

1. A vertical batch wafer processing apparatus for batch treatment of a batch of wafers which are supported in a wafer boat, the apparatus being provided with a storing device comprising:
   at least one dummy wafer storage cassette configured to store only dummy wafers having a first number of wafer slots which is greater than 30 and being distanced at a first pitch for accommodating dummy wafers;
   a plurality of standardized wafer cassettes configured to store production wafers, the standardized wafer cassettes all having the same outer dimensions and all having a second number of wafer slots being distanced at a second pitch;
   a plurality of cassette receiving sites configured to store the plurality of standardized wafer cassette;
   wherein the at least one dummy wafer storage cassette has the same outer dimensions as each one of the plurality of standardized wafer cassettes;
   wherein the second number of wafer slots is smaller than the first number of wafer slots and wherein the first pitch is smaller than the second pitch; and
   wherein dummy wafers are used as fillers to fill empty spaces between production wafers as the production wafers are treated within the vertical batch wafer processing apparatus.

2. The vertical batch wafer processing apparatus according to claim 1, wherein the storing device is embodied as a cassette storage carousel.

3. The vertical batch wafer processing apparatus according to claim 2, wherein the cassette storage carousel comprises:
   at least one platform stage,
   wherein cassette receiving sites are provided on the at least one platform stage, wherein each platform stage is connected to a central support which is mounted rotatably around a vertical axis through a central support.

4. The vertical batch wafer processing apparatus according to claim 1, wherein the at least one dummy wafer storage cassette is rigidly mounted in the storing device.

5. The vertical batch wafer processing apparatus according to claim 1, wherein the at least one dummy wafer storage cassette is removably supported in the storing device.

6. The vertical batch wafer processing apparatus according to claim 1, wherein the vertical batch wafer processing apparatus comprises:
   a processing chamber for processing the boat of wafers; and,
   a wafer handler for handling dummy between wafer slots in the at least one dummy wafer storage cassette and the boat, the wafer handler being constructed and arranged for handling dummy wafers with a diameter of 300 mm and positioned at a pitch between 3 to 9 mm, 4 to 8 mm, or 5 to 7 mm in the wafer slots of the at least one dummy wafer storage cassette.

7. The vertical batch wafer processing apparatus according to claim 1, wherein the vertical batch wafer processing apparatus comprises:
   a processing chamber for processing the boat of wafers; and,
   a wafer handler for handling dummy wafers between wafer slots in the at least one dummy wafer storage cassette and the boat, the wafer handler being constructed and arranged for handling dummy wafers with a diameter of 150 or 200 mm and positioned at a pitch between 2 to 6 mm, or 3 to 4 mm in the wafer slots of the at least one dummy wafer storage cassette.

8. The vertical batch wafer processing apparatus according to claim 1, wherein the first number is greater than 30 and wherein the second number is 25.

9. A method for treating wafers in a processing chamber of a vertical batch wafer processing apparatus for batch treatment of a batch of wafers which are supported in a wafer boat, the method comprising:
   providing at least one dedicated dummy wafer storage cassette configured to store only dummy wafers and having a first number of wafer slots distanced at a first pitch for accommodating the dummy wafers,
   providing a plurality of standardized wafer cassettes each having a second number of wafer slots distanced at a second pitch and configured to accommodate production wafers,
   wherein dummy wafers are used as fillers to fill empty spaces between production wafers as the production wafers are treated within the vertical batch wafer processing apparatus;
   wherein the at least one dedicated dummy wafer storage cassette has substantially the same outer dimension as each one of the plurality of standardized wafer cassettes wherein the first pitch is smaller than the second pitch and wherein the second number of wafer slots is smaller than the first number of wafer slots;

providing at least one dummy wafer in the dummy wafer storage cassette;

providing a plurality of production wafers in at least one of the standardized wafer cassettes;

placing at least one of the plurality of production wafers from the at least one standardized wafer cassette and placing at least one dummy wafer from the dedicated dummy wafer storage cassette in the wafer boat of the vertical batch wafer processing apparatus;

treating the wafers in the wafer boat within the processing chamber; and placing the at least one dummy wafer back in the dummy wafer storage cassette.

10. The method according to claim 9, wherein the first number is greater than 30 and wherein the second number is 25.

* * * * *